(12) United States Patent
Mehrotra et al.

(10) Patent No.: US 11,640,997 B2
(45) Date of Patent: May 2, 2023

(54) BURIED ZENER DESIGN

(71) Applicant: NXP B.V., Eindhoven (NL)

(72) Inventors: Saumitra Raj Mehrotra, Scottsdale, AZ (US); Kejun Xia, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/192,060

(22) Filed: Mar. 4, 2021

(65) Prior Publication Data

US 2022/0285564 A1 Sep. 8, 2022

(51) Int. Cl.
*H01L 29/866* (2006.01)
*H01L 21/265* (2006.01)
*H01L 29/66* (2006.01)

(52) U.S. Cl.
CPC ...... *H01L 29/866* (2013.01); *H01L 21/26513* (2013.01); *H01L 29/66106* (2013.01)

(58) Field of Classification Search
None
See application file for complete search history.

(56) References Cited

U.S. PATENT DOCUMENTS

| | | |
|---|---|---|
| 4,672,403 A | 6/1987 | Jennings |
| 5,883,414 A | 3/1999 | Ito |
| 6,706,606 B2 | 3/2004 | Romas, Jr. et al. |
| 8,198,703 B2 | 6/2012 | Lin et al. |
| 2008/0203519 A1* | 8/2008 | Min ...................... H01L 21/761 257/501 |
| 2011/0169564 A1 | 7/2011 | Jensen et al. |
| 2011/0175199 A1* | 7/2011 | Lin ...................... H01L 29/0646 257/605 |
| 2011/0227154 A1* | 9/2011 | Ono ...................... H01L 29/7802 257/E29.256 |
| 2013/0082768 A1 | 4/2013 | Hirler et al. |

OTHER PUBLICATIONS

English translation of CN 101442077 (Year: 2009).*
A machine translation to English of the specification of Chen (CN101442077, Year: 2009) downloaded from the EPO Espacenet on Aug. 23, 2022.

* cited by examiner

*Primary Examiner* — Xiaoming Liu

(57) ABSTRACT

A method for manufacturing a Zener diode includes implanting an N-type Buried Layer (NBL) with an N-type dopant in a first epitaxial layer, wherein the NBL comprises an NBL opening excluding the N-type dopant. A P-type Buried Layer (PBL) having a peak PBL doping concentration below the NBL is implanted. A second epitaxial layer is grown over the NBL. A P-type region (Plink) is implanted to couple to the PBL above the NBL opening, and to couple the Plink to an Anode electrode. An N-type region (Nlink) is implanted to couple the NBL to a Cathode electrode.

6 Claims, 10 Drawing Sheets

BURIED ZENER DESIGN

FIELD

This disclosure relates generally to Zener diodes, and more specifically to a manufacturing process and design for a Zener diode confined to a subsurface region of a semiconductor.

BACKGROUND

Precision analog circuitry requires an accurate voltage reference circuit. A Zener diode is a critical component in a circuit operation of a Zener reference circuit, commonly used to provide an accurate voltage reference. In a semiconductor device, a surface operated diode junction breakdown is prone to crystal imperfections and other contamination, thus Zener diodes formed at the surface are noisier and less stable than those that are buried or formed below the semiconductor surface.

A buried Zener diode also provides better immunity from stress originating from glass fillers as the junction is formed below the surface of the silicon. Most buried Zener diode designs utilize surface implants and thermal diffusion to create a deeper junction, which imposes limits on the depth of the Zener diode as well impacting the thermal budget of other implanted junctions.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for methods for fabricating a buried subsurface Zener diode using an epitaxial process to define the Zener junction at a desired depth. This approach allows for a much deeper Zener diode junction than otherwise available. Accordingly, in at least some embodiments, improvements are obtained in at least breakdown voltage, diode noise, stability and immunity for surface stress in semiconductor processes, amongst other benefits. Accurate Zener diodes have many uses including providing an accurate voltage reference, usable in a variety of electronic circuits.

Figure 1:
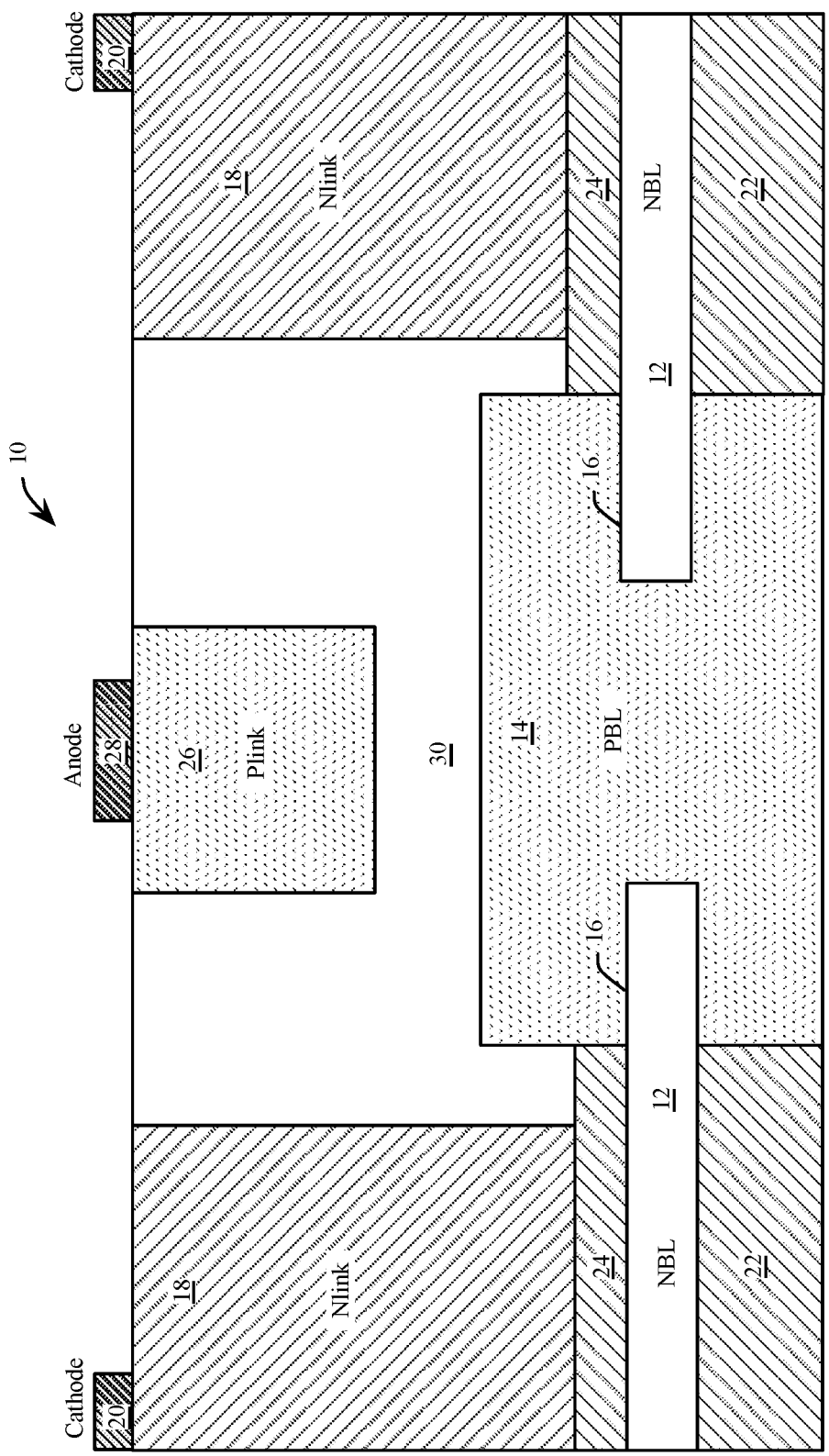
FIG. 1 is a schematic view of a buried Zener design, in accordance with an example embodiment of the present disclosure.

FIG. 1 shows a schematic view of an example embodiment 10 of a Zener (e.g. Zener diode) design, according to the present disclosure. The example embodiment 10 includes an N-type Buried Layer (NBL) 12. A P-type Buried Layer (PBL) 14 is implanted to have a peak PBL doping concentration below the NBL 12, and contactable with the surface of the Zener through an opening in the NBL 12. In one example, the PBL is formed by implanting Boron (B) with a doping concentration on the order of $1e18/cm3$. The N-type dopant species chosen to define the NBL 12 and the PBL 14 have low diffusivity to provide for a sharp doping transition or Zener junction 16. In one example, the NBL is formed by implanting one or more of Antimony (Sb) and Arsenic (As) with a peak doping concentration on the order of $1e19/cm3$.

An Nlink region 18 is formed to connect the NBL 12 to a Cathode electrode 20 on a surface of the device. In one embodiment, the Nlink 18 physically contacts the NBL 12 directly to form the connection between the NBL 12 and the Cathode electrode 20. In another embodiment, an N-type dopant species having a higher diffusivity than that used to form the NBL 12 is used to form a further connection between the NBL 12 and the Nlink 18, resulting from the out diffusion at regions 22 and 24. In one example, the regions 22 and 24 are formed by implanting Phosphorous (P) with a doping concentration of $1e17/cm3$. A Plink 26 is formed using a P-type dopant to form a connection between the PBL 14 and an Anode electrode 28 on the surface of the device. In one embodiment, the PBL 14 connects to the Plink 26 through a doped epitaxial region (epi) 30 having a P-type doping concentration on the order of $1e15/cm3$. In another embodiment, the Plink 26 physically contacts the PBL 14 to reduce a resistance of the formed Zener diode.

Figure 2:
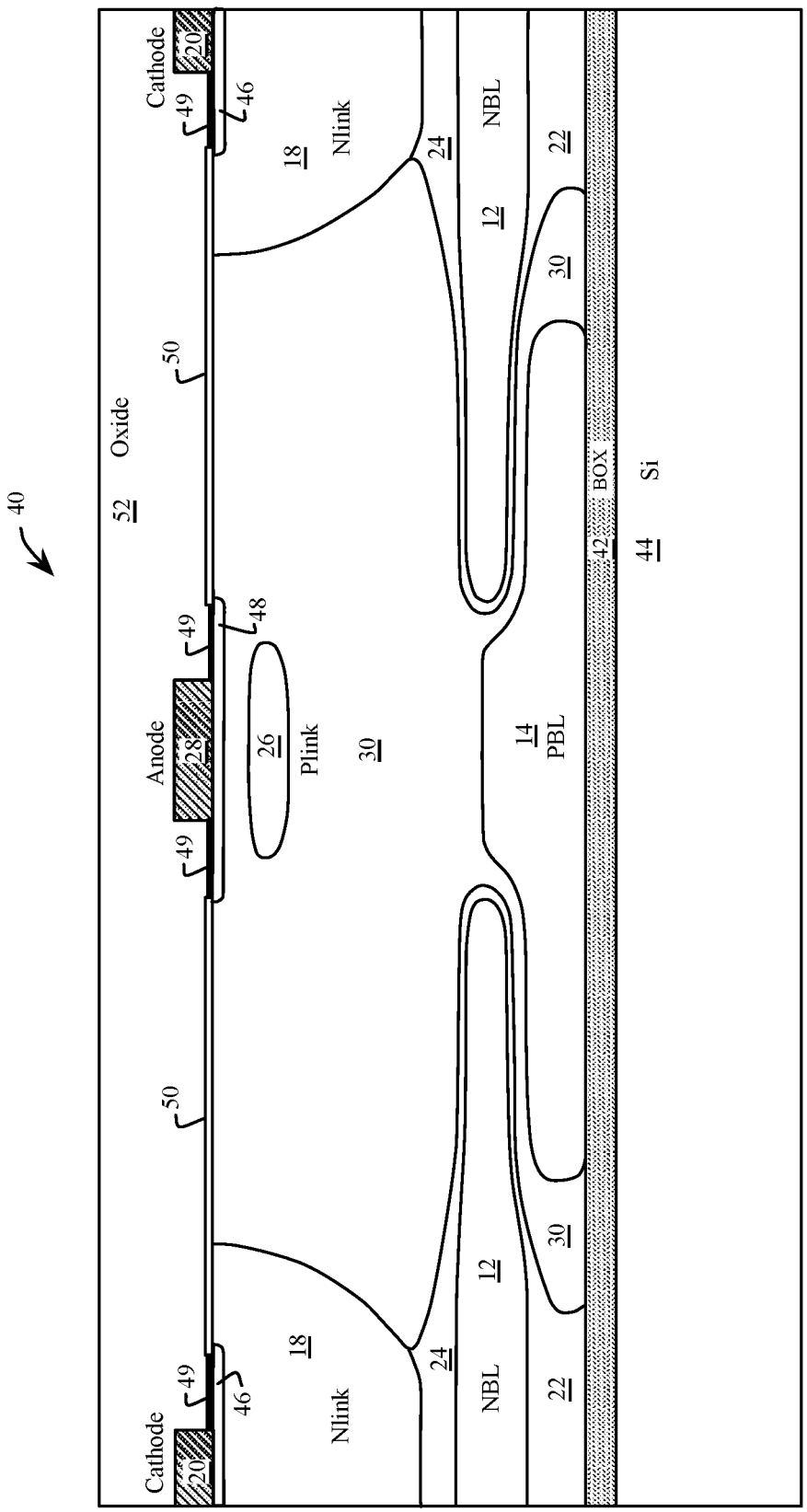
FIG. 2 is a cross-sectional view of a buried Zener design, in accordance with an example embodiment of the present disclosure.
Figure 3:
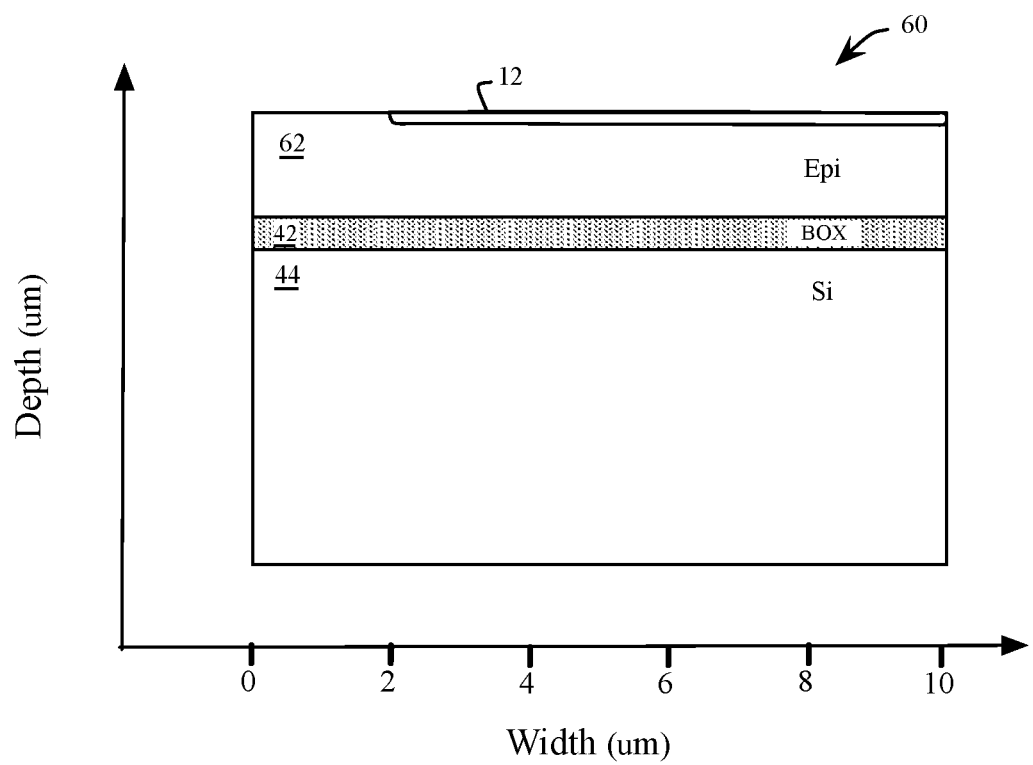
FIG. 3 is a cross-sectional view of a fabrication stage of the Zener device of FIG. 2, in accordance with an example embodiment of the present disclosure.

FIG. 2 shows a cross-sectional view of an example embodiment 40 of a Zener (e.g. Zener diode) design, according to the present disclosure. FIG. 2, with continued reference to FIG. 1 shows a Zener diode built on top of a Bulk Oxide (BOX) 42, formed on a Silicon (Si) substrate 44. An N-type Source/Drain implant (NSD) 46 is formed to reduce a contact resistance between the Nlink 18 and the Cathode electrode 20. Similarly, a P-type Source/Drain implant (PSD) 48 is formed to reduce a contact resistance between the Plink 26 and the Anode electrode 28. In one embodiment, a salicide layer is formed over the NSD 46 and PSD 48 implanted layers, and a Salicide block layer 50 is used to electrically isolate the NSD 46 from the PSD 48. A protective oxide 52 is grown on the surface of the Zener diode, covering the Cathode electrodes 20 and the Anode electrode 28. FIG. 3 through FIG. 14 further describe various fabrication steps used to manufacture the example embodiment 40 of FIG. 2.

FIG. 1 through FIG. 8 show the sequential fabrication steps for the formation of the example embodiment 40 of FIG. 2. The example embodiment 40 is formed through progressive layering, depositions and implantation steps starting with a first silicon epitaxial region 62 formed over a BOX 42 on a silicon substrate 44. Referring to the example embodiment 60 of FIG. 3, with reference to FIG. 2, the NBL 12 is implanted into the first epitaxial region 62. The implanting of NBL 12 uses a combination of low energy Antimony, Arsenic and Phosphorous as previously discussed with reference to FIG. 1. Referring to the example embodiment 70 of FIG. 4, with reference to FIG. 2 and FIG. 3, the PBL 14 is implanted with a high energy Boron implant, so that the peak Boron concentration occurs beneath (e.g., below) the NBL 12.

Figure 4:
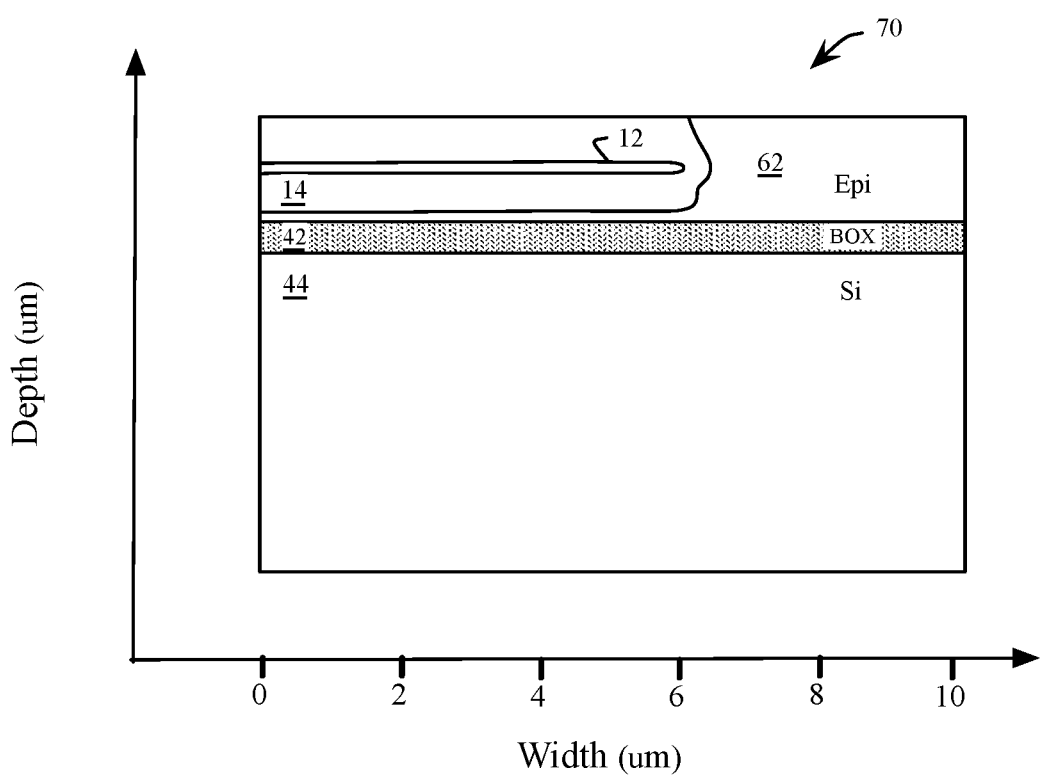
FIG. 4 is a cross-sectional view of a fabrication stage of the Zener device of FIG. 2, in accordance with an example embodiment of the present disclosure.
Figure 5:
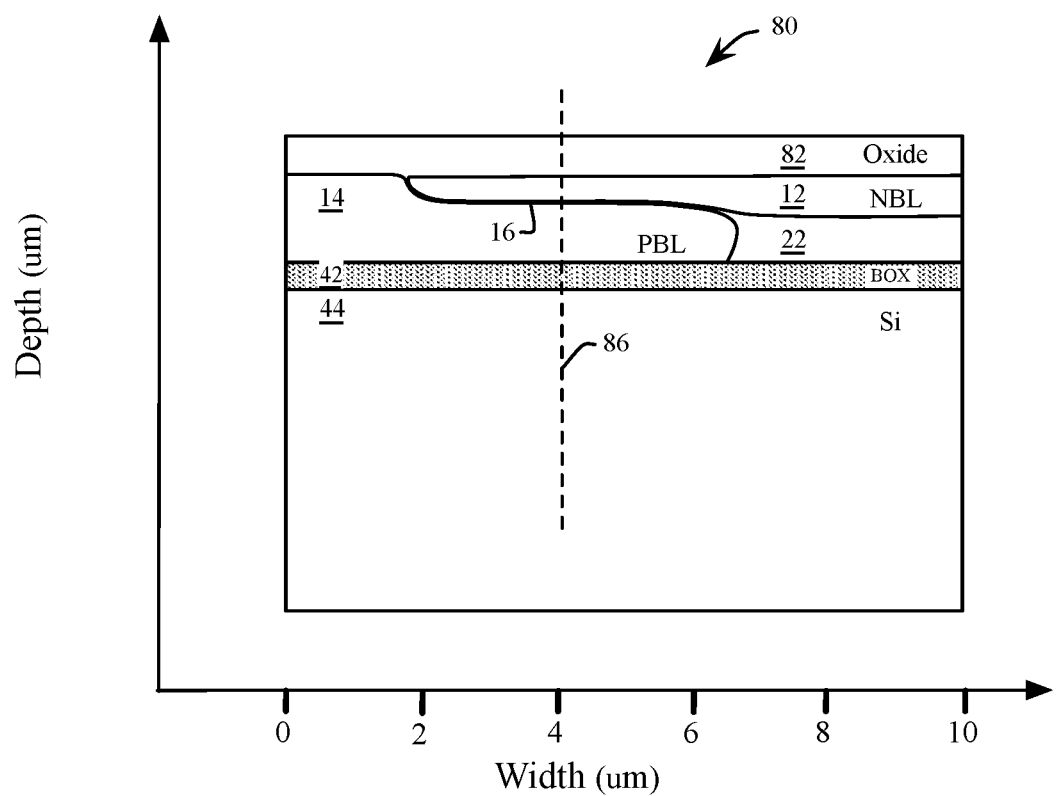
FIG. 5 is a cross-sectional view of a fabrication stage of the Zener device of FIG. 2, in accordance with an example embodiment of the present disclosure.
Figure 6:
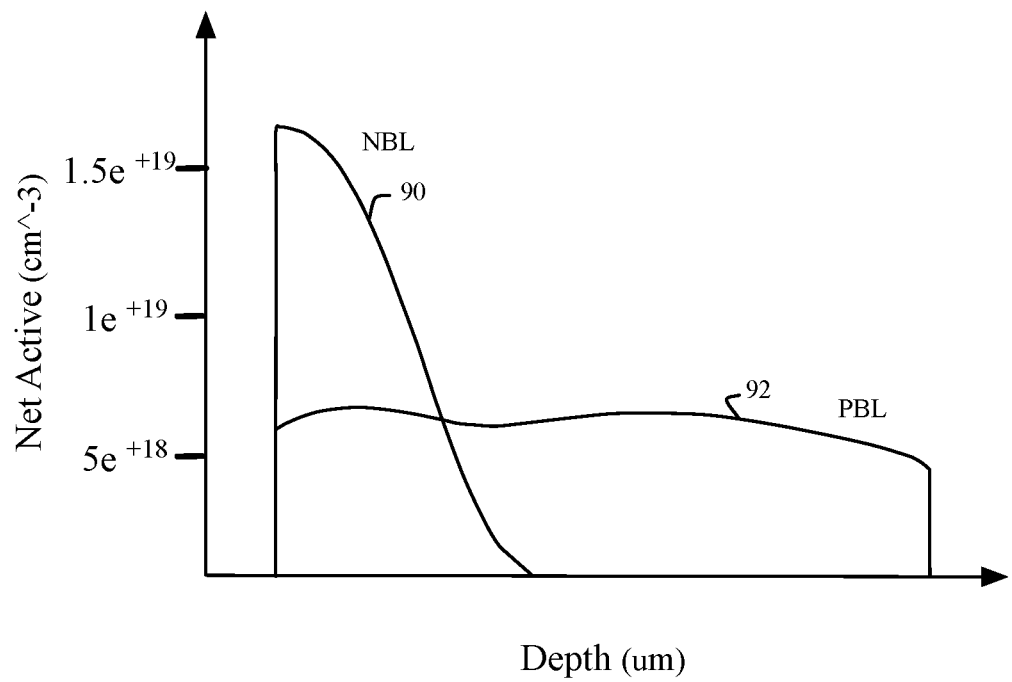
FIG. 6 is a graphical view of a doping profile of the device of FIG. 5, in accordance with an example embodiment of the present disclosure.
Figure 7:
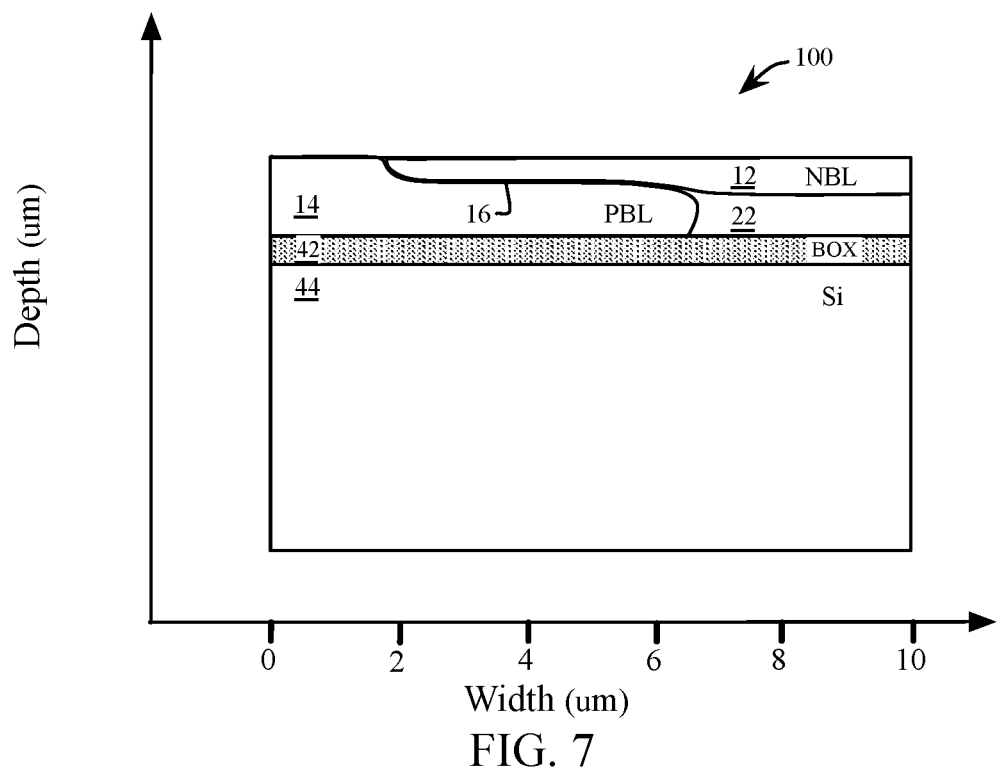
FIG. 7 is a cross-sectional view of a fabrication stage of the Zener device of FIG. 2, in accordance with an example embodiment of the present disclosure.
Figure 8:
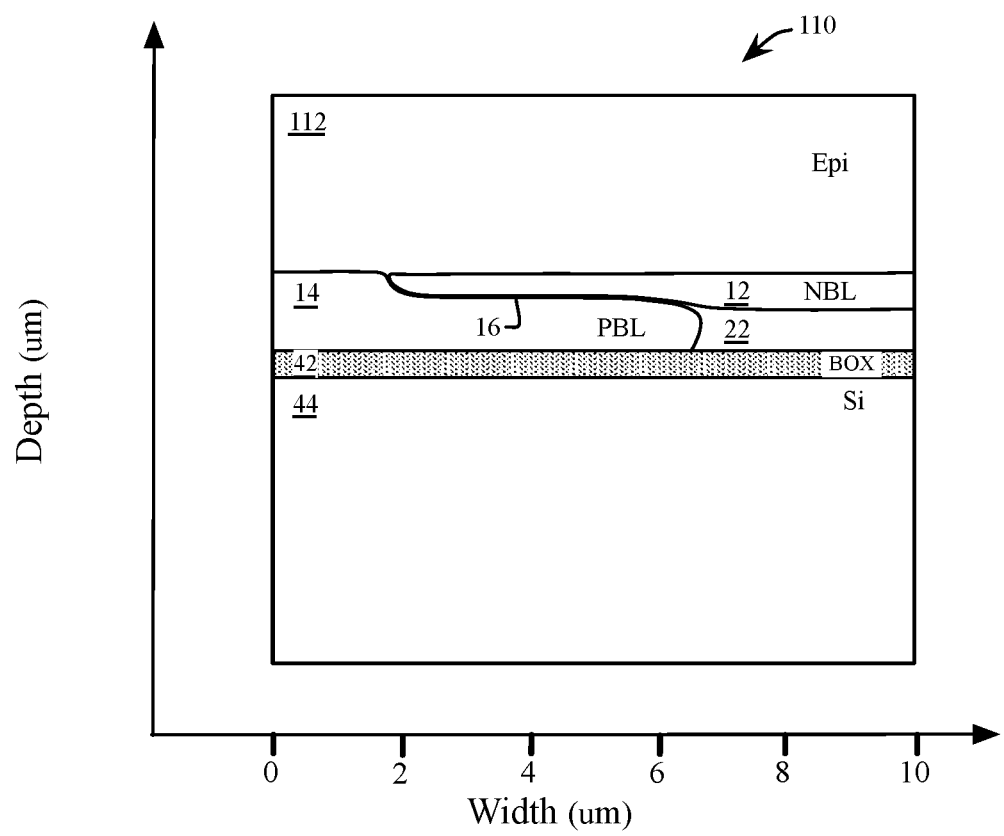
FIG. 8 is a cross-sectional view of a fabrication stage of the Zener device of FIG. 2, in accordance with an example embodiment of the present disclosure.

Referring to the example embodiment 80 of FIG. 5, with reference to FIG. 2 and FIG. 4, a high temperature oxide 82 is grown over the NBL 12. The oxide 82 limits out diffusion of the dopant species from the NBL 12 and PBL 14. Concurrently, the high thermal budget used to form the oxide 82, causes the PBL 14 to laterally diffuse (e.g., "flatten") because the Boron used in the PBL 14 has a higher diffusivity than either Antinomy or Arsenic used in the NBL 12. Accordingly, a sharp Zener junction 16 is formed between the NBL 12 and the PBL 14. A doping profile taken along 86 is shown in FIG. 6, showing an NBL doping profile 90 with low diffusivity, and a PBL doping profile 92 showing the results of lateral diffusion from the high temperature growth of the oxide 82. Referring to the example embodiment 100 of FIG. 7, with reference to FIG. 2 and FIG. 5, the oxide 82 is removed. Referring to the example embodiment 110 of FIG. 8, with reference to FIG. 2 and FIG. 7, a second silicon epitaxial layer 112 is grown over the NBL 12 to define a vertical depth of the Zener junction 16 from the surface of the example embodiment 110. Specifically, the second silicon epitaxial layer 112 is grown over the first silicon epitaxial layer 62, where the first silicon epitaxial layer 62 includes the formed PBL 14 and NBL 12 layers. The second epitaxial layer 112 is lightly doped, (relative to the PBL 14 and NBL 12 layers), with a P-type dopant to form the doped epitaxial region 30, shown in FIG. 1, FIG. 2, FIG. 9 and FIG. 11.

Figure 9:
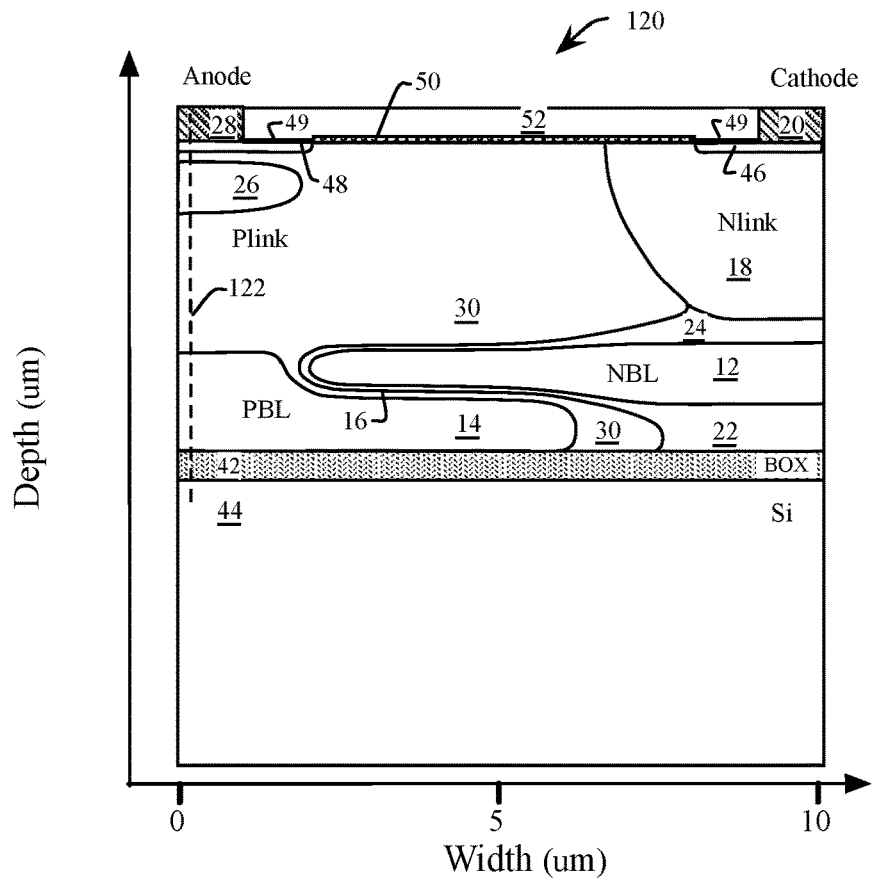
FIG. 9 is a cross-sectional view of a fabrication stage of the Zener device of FIG. 2, in accordance with an example embodiment of the present disclosure.
Figure 10:
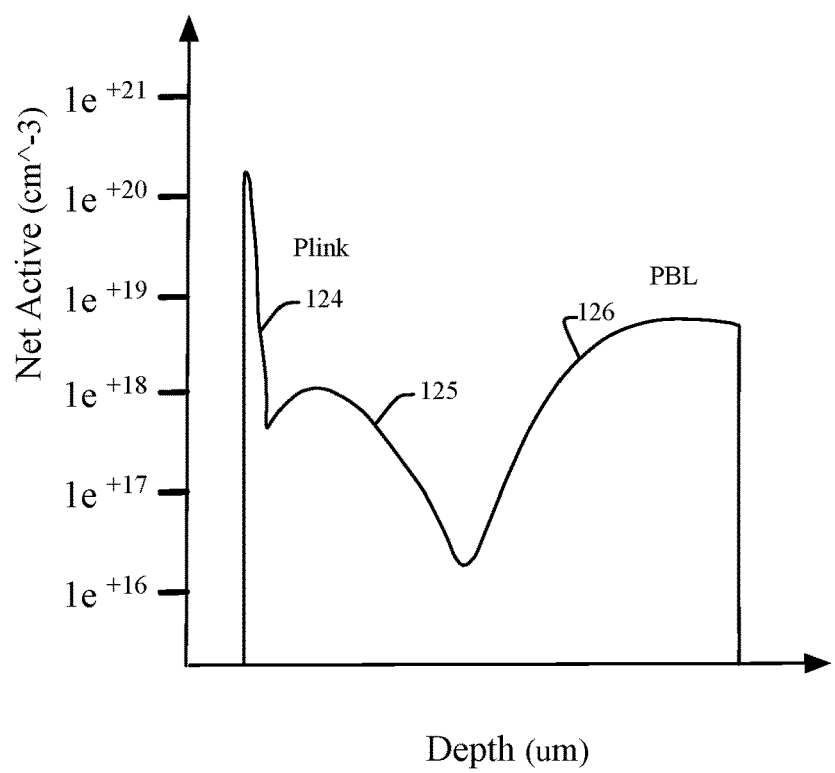
FIG. 10 is a graphical view of a doping profile of the device of FIG. 9, in accordance with an example embodiment of the present disclosure.
Figure 11:
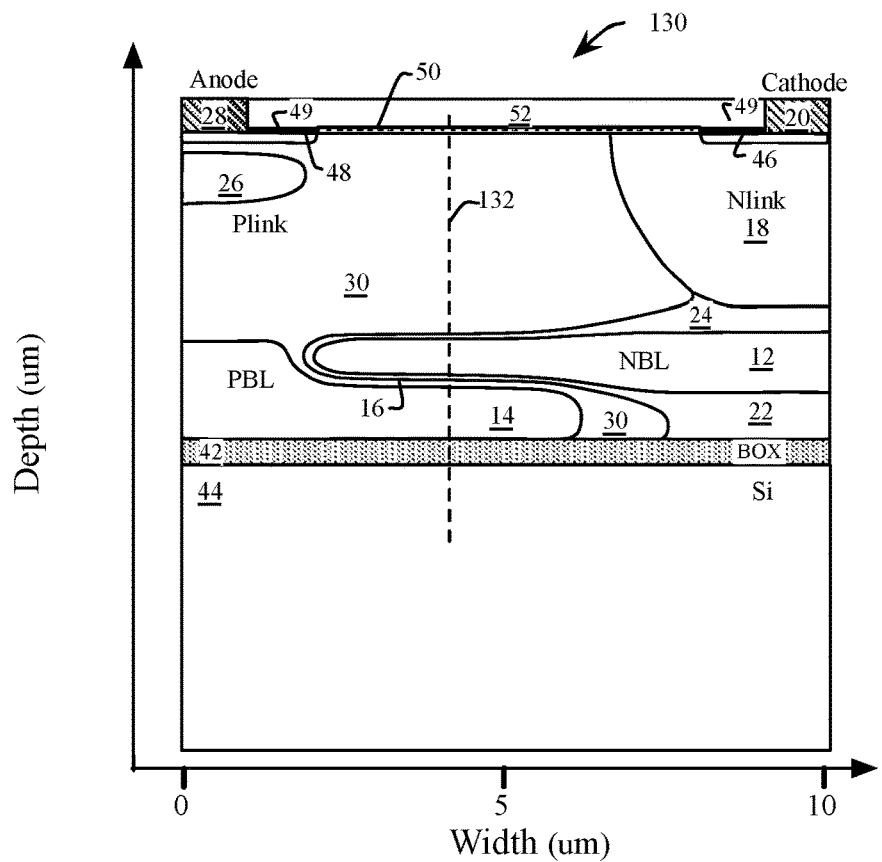
FIG. 11 is a cross-sectional view of a fabrication stage of the Zener device of FIG. 2, in accordance with an example embodiment of the present disclosure.
Figure 12:
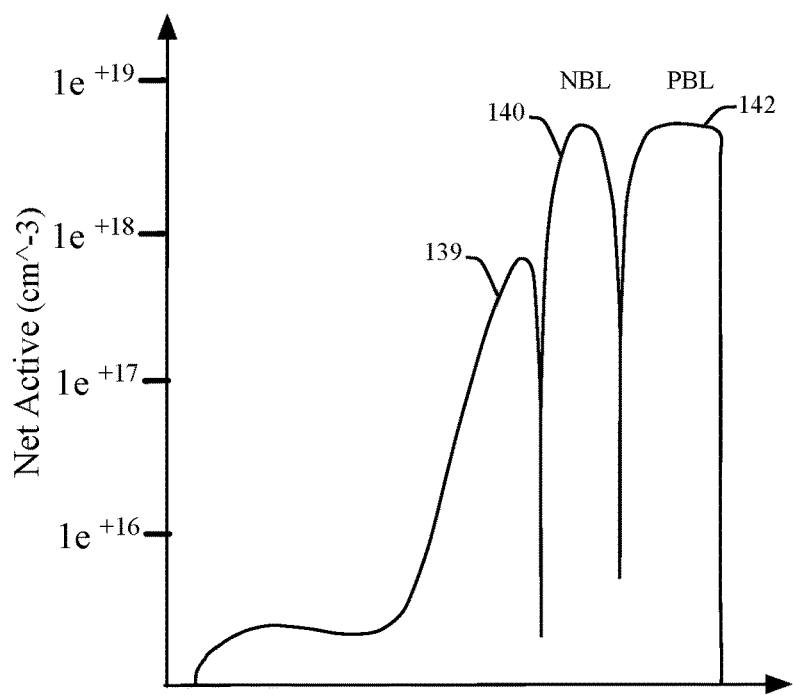
FIG. 12 is a graphical view of a doping profile of the device of FIG. 11, in accordance with an example embodiment of the present disclosure.

Referring to the example embodiment 120 of FIG. 9, with reference to FIG. 2, a dopant profile taken along 122 is shown in FIG. 10. The example embodiment 120 shows a high P-type doping profile 124 for the PSD implant 48, a lower doping concentration 125 for the Plink implant 26 and a moderate doping concentration 126 for the PBL 14. Referring to the example embodiment 130 of FIG. 11, with reference to FIG. 2, a dopant profile taken along 132 is shown in FIG. 12. The example embodiment 130 shows a moderate doping concentration 139 for the doped epitaxial region 30, and higher doping concentrations 140 and 142 for the NBL 12 and PBL 14 respectively.

Figure 13:
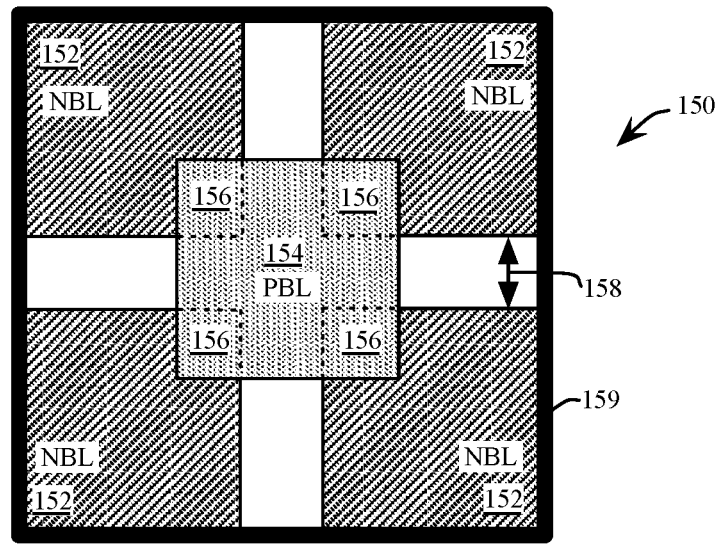
FIG. 13 is a plan view of a buried Zener design, in accordance with an example embodiment of the present disclosure.

FIG. 13, with reference to FIG. 2 shows a plan view of a buried Zener design, in accordance with an example embodiment 150 of the present disclosure. The example embodiment 150 includes an NBL mask 152 to define an implant region for the NBL 12. A PBL mask 154 defines an implant region for the PBL 14. An overlap of the NBL mask 152 and the PBL mask 154 defines the regions 156 for the resulting Zener junctions 16. An opening 158 is defined to allow the PBL 14 to connect to the Plink 26 (see FIG. 2). The entire Zener diode structure of FIG. 13 is surrounded by an outer trench 159, for example a Deep Trench Isolation.

Figure 14:
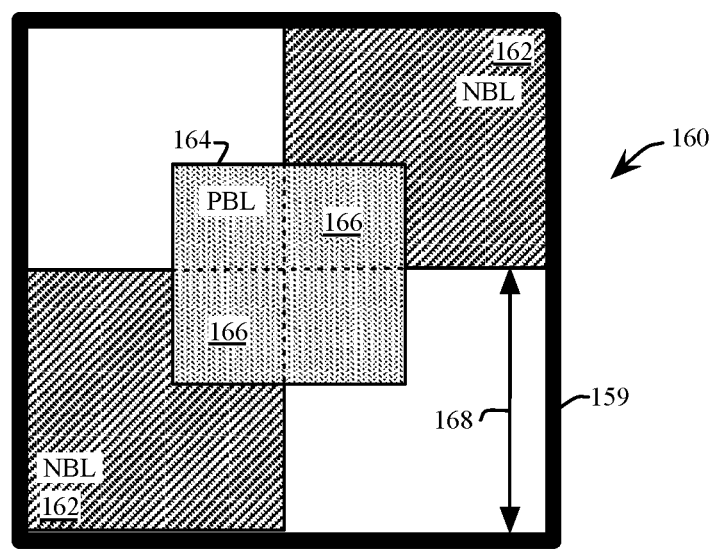
FIG. 14 is a plan view of another buried Zener design, in accordance with an example embodiment of the present disclosure.

FIG. 14, with reference to FIG. 2 shows a plan view of another buried Zener design, in accordance with an example embodiment 160 of the present disclosure. Similar to the embodiment 150, the example embodiment 160 includes an NBL mask 162, a PBL mask 164 and defined regions 166 for the resulting Zener junction 16. An opening 168 is defined to allow the PBL 14 to connect to the Plink 26 (see FIG. 2). The entire Zener diode structure of FIG. 14 is surrounded by an outer trench 159, for example a Deep Trench Isolation. It should be understood that other plan views of the Zener diode structure are realizable without limiting the scope of the embodiments disclosed herein.

Figure 15:
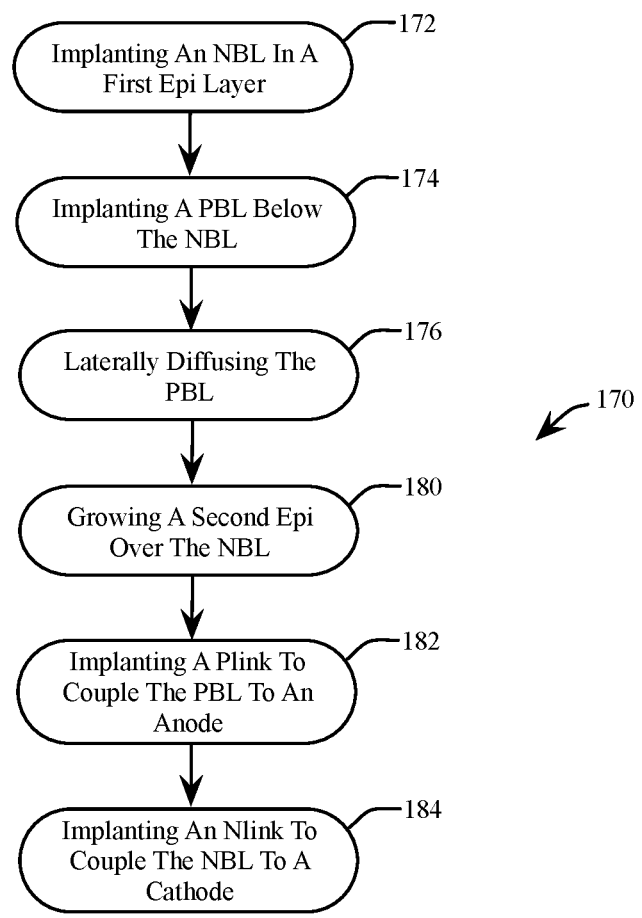
FIG. 15 is a flowchart representation of a method for manufacturing a buried Zener design in accordance with an example embodiment of the present disclosure.

FIG. 15 shows an example embodiment 170 of a method for manufacturing a buried Zener design. With reference to FIG. 15 and the manufacturing steps shown in FIG. 3 to FIG. 14, at 172 an NBL 12 is implanted in a first epi layer 62 (see FIG. 3). At 174, a PBL 14 is implanted below the NBL 12 (see FIG. 4). At 176, the PBL 14 is laterally diffused (see FIG. 5 and FIG. 6). At 180, a second epi 112 is grown over the NBL 12 (see FIG. 8). At 182, a Plink 26 is implanted to couple the PBL 14 to an Anode electrode 28 (see FIG. 9 or FIG. 11). At 184, an Nlink 18 is implanted to couple the NBL 12 to a Cathode electrode 20 (see FIG. 9 or FIG. 11).

Figure 16:
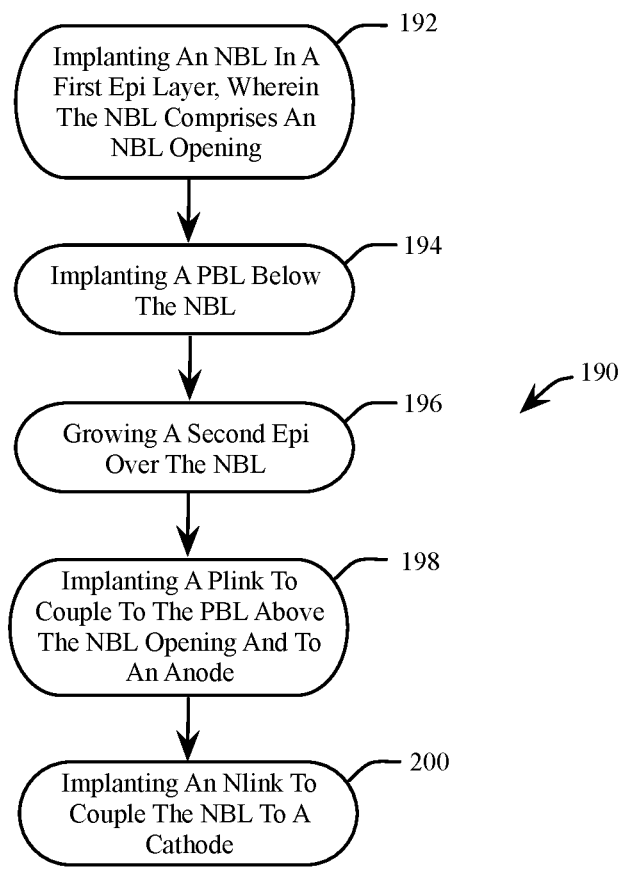
FIG. 16 is another flowchart representation of a method for manufacturing a buried Zener design in accordance with an example embodiment of the present disclosure.

FIG. 16 shows another example embodiment 190 of a method for manufacturing a buried Zener design. With reference to FIG. 16 and the manufacturing steps shown in FIG. 3 to FIG. 14, at 192 an NBL 12 is implanted in a first epi layer 62 (see FIG. 3), wherein the NBL 12 comprises an NBL opening 158 or 168, (see FIG. 13 or FIG. 14 respectively). At 194, a PBL 14 is implanted below the NBL 12 (see FIG. 4). At 196, a second epi 112 is grown over the NBL 12 (see FIG. 8). At 198, a Plink 26 is implanted to couple the PBL 14 to an Anode electrode 28 (see FIG. 9 or FIG. 11), above the NBL opening 158 or 168, (see FIG. 13 or FIG. 14 respectively). At 200, an Nlink 18 is implanted to couple the NBL 12 to a Cathode electrode 20 (see FIG. 9 or FIG. 11).

As will be appreciated, embodiments as disclosed include at least the following. In one embodiment, a method for manufacturing a Zener diode comprises implanting an N-type Buried Layer (NBL) in a first epitaxial layer. A P-type Buried Layer (PBL) having a peak PBL doping concentration below the NBL is implanted. The PBL is laterally diffused. A second epitaxial layer is grown over the NBL. A P-type region (Plink) is implanted for coupling the PBL to an Anode electrode. An N-type region (Nlink) is implanted for coupling the NBL to a Cathode electrode.

Alternative embodiments of the method for manufacturing a Zener diode include one of the following features, or any combination thereof. Implanting the NBL comprises implanting with at least one of Antimony and Arsenic, to form a Zener junction between the NBL and the PBL. The NBL is implanted with Phosphorous to connect the Nlink to the NBL through diffusion of the Phosphorous towards to Nlink. Implanting the Nlink comprises implanting with a Phosphorous implant. Implanting the PBL comprises implanting with a Boron implant. The Plink is connected to the PBL through the second epitaxial layer, wherein the second epitaxial layer comprises a P-type dopant having a lower first dopant concentration than a second dopant concentration of the Plink. The Plink is physically connected to the PBL. The Cathode electrode is laterally separated from the Anode electrode with a Salicide block layer deposited over the second epitaxial layer. The first epitaxial layer is formed over a Bulk Oxide formed over a Silicon layer.

In another embodiment, a Zener diode comprises an N-type Buried Layer (NBL) in a first epitaxial layer. A P-type Buried Layer (PBL) has a peak PBL doping concentration below the NBL. A second epitaxial layer is over the NBL. A P-type region (Plink) is coupled to the PBL and to an Anode electrode. An N-type region (Nlink) is coupled to the NBL and to a Cathode electrode.

Alternative embodiments of the Zener diode include one of the following features, or any combination thereof. The NBL comprises at least one of Antimony and Arsenic to form a Zener junction between the NBL and the PBL. The NBL comprises Phosphorous to connect the NBL to the Nlink through diffusion of the Phosphorous towards the Nlink. The Nlink physically contacts the NBL. The PBL comprises Boron. The Plink couples to the PBL through the second epitaxial layer, wherein the second epitaxial layer comprises a P-type dopant having a lower first dopant concentration than a second dopant concentration of the Plink. An opening in the NBL is formed to couple the Plink to the PBL.

In another embodiment, a method for manufacturing a Zener diode comprises implanting an N-type Buried Layer (NBL) with an N-type dopant in a first epitaxial layer, wherein the NBL comprises an NBL opening excluding the N-type dopant. A P-type Buried Layer (PBL) having a peak PBL doping concentration below the NBL is implanted. A second epitaxial layer is grown over the NBL. A P-type region (Plink) is implanted to couple to the PBL above the NBL opening, and to couple the Plink to an Anode electrode. An N-type region (Nlink) is implanted to couple the NBL to a Cathode electrode.

Alternative embodiments of the method for manufacturing a Zener diode include one of the following features, or any combination thereof. Implanting the NBL comprises implanting with at. least one of Antimony and Arsenic, to form a Zener junction between the NBL and the PBL. The NBL is implanted with Phosphorous to connect the Nlink to the NBL through diffusion of the Phosphorous towards to Nlink. The Zener diode is thermally annealing to laterally diffuse the PBL.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A Zener diode comprising:
an N-type Buried Layer (NBL) in a first epitaxial layer;
a P-type Buried Layer (PBL) having a peak PBL doping concentration below the NBL;
a second epitaxial layer over the NBL;
a P-type region (Plink) coupled to the PBL and to an Anode electrode; and
an N-type region (Nlink) coupled to the NBL and to a Cathode electrode;
wherein the Plink couples to the PBL through the second epitaxial layer, wherein the second epitaxial layer comprises a P-type dopant having a lower first dopant concentration than a second dopant concentration of the Plink.

2. The apparatus of claim 1 wherein the NBL comprises at least one of Antimony and Arsenic to form a Zener junction between the NBL and the PBL.

3. The apparatus of claim 1 wherein the NBL comprises Phosphorous to connect the NBL to the Nlink through diffusion of the Phosphorous towards the Nlink.

4. The apparatus of claim 1 wherein the Nlink physically contacts the NBL.

5. The apparatus of claim 1 wherein the PBL comprises Boron.

6. The apparatus of claim 1 wherein an opening in the NBL is formed to couple the Plink to the PBL.

* * * * *